(12) United States Patent
Stowell et al.

(10) Patent No.: US 8,057,649 B2
(45) Date of Patent: Nov. 15, 2011

(54) MICROWAVE ROTATABLE SPUTTERING DEPOSITION

(75) Inventors: Michael W. Stowell, Loveland, CO (US); Nety Krishna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 825 days.

(21) Appl. No.: 12/115,717

(22) Filed: May 6, 2008

(65) Prior Publication Data

US 2009/0277778 A1    Nov. 12, 2009

(51) Int. Cl.
*C25B 9/00* (2006.01)
*C25B 11/00* (2006.01)
*C25B 13/00* (2006.01)
*C23C 14/00* (2006.01)

(52) U.S. Cl. ......... 204/298.06; 204/298.11; 204/298.16; 204/298.17; 204/298.21; 204/298.22

(58) Field of Classification Search ............. 204/298.06, 204/298.11, 298.16, 298.17, 298.21, 298.22
See application file for complete search history.

(56) References Cited

U.S. PATENT DOCUMENTS

| | | |
|---|---|---|
| 3,999,918 A | 12/1976 | Landsman |
| 4,185,252 A | 1/1980 | Gerlach |
| 4,374,158 A | 2/1983 | Taniguchi et al. |
| 4,511,520 A | 4/1985 | Bowen |
| 4,521,447 A | 6/1985 | Ovshinsky et al. |
| 4,545,646 A | 10/1985 | Chern et al. |
| 4,927,704 A | 5/1990 | Reed et al. |
| 4,953,498 A | 9/1990 | Hashizume et al. |
| 5,006,218 A | 4/1991 | Yoshida et al. |
| 5,178,739 A * | 1/1993 | Barnes et al. ............ 204/192.12 |
| 5,242,566 A | 9/1993 | Parker |
| 5,304,277 A | 4/1994 | Ohara et al. |
| 5,387,288 A | 2/1995 | Shatas |
| 5,527,391 A | 6/1996 | Echizen et al. |
| 5,643,638 A | 7/1997 | Otto et al. |
| 5,672,211 A | 9/1997 | Mai et al. |
| 5,688,382 A | 11/1997 | Besen et al. |

(Continued)

FOREIGN PATENT DOCUMENTS

JP      02050960 A  *  2/1990

(Continued)

OTHER PUBLICATIONS

U.S. Appl. No. 12/833,473, filed Jul. 9, 2010, Stowell.

(Continued)

*Primary Examiner* — Alexa Neckel
*Assistant Examiner* — Michael Band
(74) *Attorney, Agent, or Firm* — Kilpatrick Townsend & Stockton LLP

(57) ABSTRACT

Disclosed is an invention that uses a coaxial microwave antenna as a primary plasma source in PVD. The coaxial microwave antenna is positioned inside a sputtering target. Instead of using a cathode assist in sputtering, microwaves generated from the coaxial microwave antenna may leak through the sputtering target that comprises a dielectric material to form microwave plasma outside the sputtering target. To further enhance plasma density, a magnetron or a plurality of magnetrons may be added inside the target to help confine secondary electrons. An electric potential may be formed between adjacent magnetrons and may further enhance ionization. To achieve directional control of the generated microwaves, a shield that comprises a dielectric material or dielectric material coated metal may be added proximate the coaxial microwave antenna. Furthermore, for high utilization of expensive target materials, a target can rotate to improve the utilization efficiency.

16 Claims, 11 Drawing Sheets

U.S. PATENT DOCUMENTS

| | | | |
|---|---|---|---|
| 5,749,966 | A | 5/1998 | Shates |
| 5,900,699 | A | 5/1999 | Samukawa et al. |
| 5,965,246 | A | 10/1999 | Guiselin et al. |
| 5,985,102 | A | 11/1999 | Leiphart |
| 5,990,984 | A | 11/1999 | Meredith et al. |
| 6,061,077 | A | 5/2000 | Kashiwaya et al. |
| 6,096,389 | A | 8/2000 | Kanai |
| 6,121,930 | A | 9/2000 | Grangeat et al. |
| 6,238,527 | B1 | 5/2001 | Sone et al. |
| 6,290,825 | B1 | 9/2001 | Fu |
| 6,306,265 | B1 | 10/2001 | Fu et al. |
| 6,311,638 | B1 | 11/2001 | Ishii et al. |
| 6,340,417 | B1 * | 1/2002 | Krivokapic ............... 204/192.17 |
| 6,357,385 | B1 | 3/2002 | Ohmi et al. |
| 6,424,298 | B1 | 7/2002 | Nishikawa et al. |
| 6,620,296 | B2 | 9/2003 | Gogh et al. |
| 6,805,779 | B2 | 10/2004 | Chistyakov |
| 6,806,651 | B1 | 10/2004 | Chistyakov |
| 6,853,142 | B2 | 2/2005 | Chistyakov |
| 6,868,800 | B2 | 3/2005 | Moroz |
| 6,896,773 | B2 | 5/2005 | Chistyakov |
| 7,166,661 | B2 | 1/2007 | Kuramoto et al. |
| 7,390,573 | B2 | 6/2008 | Korevaar et al. |
| 7,459,182 | B2 | 12/2008 | Xiong et al. |
| 7,815,982 | B2 | 10/2010 | Iwanaga |
| 2001/0025607 | A1 | 10/2001 | Lebar et al. |
| 2002/0041044 | A1 | 4/2002 | Saito et al. |
| 2002/0092766 | A1 | 7/2002 | Lampkin |
| 2002/0125423 | A1 | 9/2002 | Ebeling et al. |
| 2003/0072932 | A1 | 4/2003 | Gandon |
| 2003/0150846 | A1 | 8/2003 | Ishii et al. |
| 2003/0168172 | A1 | 9/2003 | Glukhoy |
| 2003/0183518 | A1 | 10/2003 | Glocker et al. |
| 2003/0209422 | A1 | 11/2003 | Wang et al. |
| 2004/0011466 | A1 | 1/2004 | Matsumoto et al. |
| 2004/0265507 | A1 | 12/2004 | Xiong et al. |
| 2005/0121835 | A1 | 6/2005 | Herod et al. |
| 2005/0211170 | A1 | 9/2005 | Hanawa et al. |
| 2006/0078717 | A1 | 4/2006 | Yamaya et al. |
| 2006/0166515 | A1 | 7/2006 | Karim et al. |
| 2006/0191478 | A1 | 8/2006 | Gondhalekar et al. |
| 2006/0196766 | A1 | 9/2006 | Chen |
| 2006/0208634 | A1 | 9/2006 | Schaepkens et al. |
| 2006/0240232 | A1 | 10/2006 | Faris |
| 2007/0045103 | A1 | 3/2007 | Lee et al. |
| 2007/0048509 | A1 | 3/2007 | Yoneyama et al. |
| 2007/0080056 | A1 | 4/2007 | German et al. |
| 2007/0102634 | A1 | 5/2007 | Frey et al. |
| 2007/0119546 | A1 | 5/2007 | Collins et al. |
| 2007/0160822 | A1 | 7/2007 | Bristow et al. |
| 2007/0181145 | A1 | 8/2007 | Ishizuka et al. |
| 2007/0218264 | A1 | 9/2007 | Gueneau et al. |
| 2008/0118734 | A1 | 5/2008 | Goodwin et al. |
| 2008/0226924 | A1 | 9/2008 | Okubo et al. |
| 2009/0232977 | A1 | 9/2009 | Morinaga et al. |
| 2009/0238993 | A1 | 9/2009 | Stowell et al. |
| 2010/0078320 | A1 | 4/2010 | Stowell |
| 2011/0076420 | A1 * | 3/2011 | Stowell ......................... 427/569 |
| 2011/0076422 | A1 | 3/2011 | Stowell |

FOREIGN PATENT DOCUMENTS

| | | | |
|---|---|---|---|
| JP | 05-263223 A | 10/1993 | |
| JP | 06-017247 A | 1/1994 | |
| JP | 06-102827 B2 | 12/1994 | |
| JP | 08009780 B2 | 1/1996 | |
| JP | 2001-126899 A | 5/2001 | |
| JP | 2002-004044 A | 1/2002 | |
| JP | 2005-508728 A | 4/2005 | |
| JP | 2007-516347 A | 6/2007 | |
| KR | 10-2007-0112210 A | 11/2007 | |
| WO | WO 99/035302 A1 | 7/1999 | |
| WO | WO 2007-096482 A2 | 8/2007 | |

OTHER PUBLICATIONS

U.S. Appl. No. 12/833,524, filed Jul. 9, 2010, Stowell.
U.S. Appl. No. 12/833,571, filed Jul. 9, 2010, Stowell et al.
PCT International Search Report and Written Opinion mailed Dec. 18, 2009; International Application No. PCT/US2009/042891; 10 pages.
PCT International Search Report and Written Opinion mailed Jan. 12, 2010; International Application No. PCT/US2009/043986; 10 pages.
PCT International Search Report and Written Opinion mailed Apr. 7, 2010; International Application No. PCT/US2009/055626, 12 pages.
Dickson, M. et al., "Radial uniformity of an external-coil ionized physical vapor deposition source," J. Vac. Sci. Technol. B 16(2), Mar./Apr. 1998, pp. 523-531.
PCT International Search Report and Written Opinion mailed Sep. 25, 2009; International Application No. PCT/US2009/035325, 10 pages.
Zajickova, "Deposition of Protective Coatings in RF Organosilicon Discharges," Jan. 31, 2007, Institute of Physics Publishing, pp. 123-132.
PCT International Search Report and Written Opinion mailed Sep. 15, 2009; International Application No. PCT/US2009/034551, 12 pages.
PCT International Search Report and Written Opinion mailed Nov. 4, 2009; International Application No. PCT/US2009/044213, 12 pages.
U.S. Appl. No. 12/050,373, filed Mar. 18, 2008, Stowell et al.
U.S. Appl. No. 12/070,660, filed Feb. 20, 2008, Stowell et al.
U.S. Appl. No. 12/077,375, filed Mar. 19, 2008, Stowell et al.
U.S. Appl. No. 12/120,391, filed May 14, 2008, Stowell et al.
U.S. Appl. No. 12/238,685, filed Sep. 26, 2008, Stowell.
U.S. Appl. No. 12/238,664, filed Sep. 26, 2008, Stowell.
Author Unknown, "Ultrafine Zinc Oxide," Sumitomo Osaka Cement Co., Ltd., 2 pages, no date.
Author Unknown, "Zinc Oxide Profile," obtained on Oct. 15, 2007 from website http://www.mountainroseherbs.com/learn/zinc_oxide.php, 2 pages.
Erlat, Ahmet G., et al., "Morphology and gas barrier properties of thing SiOx coatings and polycarbonate: Correlations with plasma-enhanced chemical vapor deposition conditions," J. Mater. Res., vol. 15, No. 3, Mar. 2000, pp. 704-717.
Tomar, V.K., et al., "Depositions and characterization of SiOn using HMDS for Photonics applications," abstract, obtained on Oct. 16, 2007 from website http://www.iop.org/EJ/abstract/0268-1242/22/2/008, 2 pages.
Wikipedia, "Microstrip", obtained online at http://en.wikipedia.org/wiki/Microstrip on Jan. 25, 2008, 5 pages.
Wikipedia, "Microwave", obtained online at http://en.wikipedia.org/wiki/Microwave on Dec. 13, 2007, 7 pages.
Zajickova, L. et al., "Deposition of protective coatings in rf organosilicon discharges," abstract, obtained on Oct. 16, 2007 on website http://www.iop.org.EJ/abstract/0963-0252/16/1/S14, 2 pages.

* cited by examiner

MICROWAVE ROTATABLE SPUTTERING DEPOSITION

BACKGROUND OF THE INVENTION

Glow discharge thin film deposition processes are extensively used for industrial applications and materials research, especially in creating new advanced materials. Although chemical vapor deposition (CVD) generally exhibits superior performance for deposition of materials in trenches or holes, physical vapor deposition (PVD) is sometimes preferred because of its simplicity and lower cost. In PVD, magnetron sputtering is often preferred, as it may have a 100 times increase in deposition rate and a 100 times lower required discharge pressure than non-magnetron sputtering. Inert gases, especially argon, are usually used as sputtering agents because they do not react with target materials. When a negative voltage is applied to a target, positive ions, such as positively charged argon ions, hit the target and knock the atoms out. Secondary electrons are also ejected from the target surface. The magnetic field can trap the secondary electrons close to the target and the secondary electrons can result in more ionizing collisions with inert gases. This enhances the ionization of the plasma proximate the target and leads to a higher sputtering rate. It also means that the plasma can be sustained at a lower pressure. In conventional magnetron sputtering, higher deposition rate may be achieved by increasing the power to the target or decreasing the distance from the target. However, a drawback is that magnetized plasma tends to have larger variations in plasma density, because the strength of the magnetic field significantly varies with distance. This non-homogeneity may cause complications for deposition of large areas. Also, conventional magnetron sputtering has a relatively low sputtering rate.

Unlike evaporative techniques, the energy of ions or atoms in PVD is comparable to the binding energy of typical surfaces. This would in turn help increase atom mobility and surface chemical reaction rates so that epitaxial growth may occur at reduced temperatures and synthesis of chemically metastable materials may be allowed. By using energetic atoms or ions, compound formation may also become easier. An even greater advantage can be achieved if the deposition material is ionized. In this case, the ions can be accelerated to desired energies and guided in direction by using electric or magnetic fields to control film intermixing, nano- or microscale modification of microstructure, and creation of metastable phases. Because of the interest in achieving a deposition flux in the form of ions rather than neutrals, several new ionized physical vapor deposition (IPVD) techniques have been developed to ionize the sputtered material and subsequently direct the ions toward the substrate using a plasma sheath that is generated by using an RF bias on the substrate.

The ionization of atoms requires a high density plasma, which makes it difficult for the deposition atoms to escape without being ionized by energetic electrons. Capacitively generated plasmas are usually very lightly ionized, resulting in low deposition rate. Denser plasma may be created using inductive discharges. Inductively coupled plasma may have a plasma density of $10^{11}$ ions/cm$^3$, approximately 100 times higher than comparable capacitively generated plasma. A typical inductive ionization PVD uses an inductively coupled plasma that is generated by using an internal coil with a 13.56-MHz RF source. A drawback with this technique is that ions with about 100 eV in energy bombard the coil, erode the coils and then generate sputtered contaminants that may adversely affect the deposition. Also, the high energy of the ions may cause damage to the substrate. Some improvement has been made by using an external coil to resolve the problem associated with the internal ICP coil.

Another technique for increasing plasma density is using a microwave frequency source. It is well known that at low frequencies electromagnetic waves do not propagate in a plasma, but are instead reflected. However, at high frequencies such as typical microwave frequency, electromagnetic waves effectively allow direct heating of plasma electrons. As the microwave inputs energy into the plasma, collisions can occur to ionize the plasma so that higher plasma density can be achieved. Typically, horns are used to inject microwave or a small stub antenna is placed in the vacuum chamber adjacent to a sputtering cathode for inputting the microwave into the chamber. However, this technique does not provide a homogeneous assist to enhance plasma generation. It also may not provide enough plasma density to sustain its own discharge without the assistance of the sputtering cathode. Additionally, scale up of such systems for large area deposition is limited to a length on the order of 1 meter or less due to non-linearity.

There still remains a need for providing a high density homogeneous discharge adjacent to a sputtering target to increase localized ionization efficiency and depositing films over large areas. There is also a need for lowering the energy of the ions to reduce surface damage to the substrate and thus reduce defect densities. There is a further need to affect the microstructure growth and deposition coverage such as gap-fill in narrow trenches and to enhance film chemistry through controlling ion density and ion energy in the bulk plasma and proximate the substrate surface.

BRIEF SUMMARY OF THE INVENTION

Embodiments of the invention use a coaxial microwave antenna as a primary plasma source in PVD. The coaxial microwave antenna is positioned inside a sputtering target. Instead of using a cathode assist in sputtering, microwaves generated from the coaxial microwave antenna may leak through the sputtering target that comprises a dielectric material to form microwave plasma outside the sputtering target. To further enhance plasma density, a magnetron or a plurality of magnetrons may be added inside the target to help confine secondary electrons. An electric potential may be formed between adjacent magnetrons and may further enhance ionization. To achieve directional control of the generated microwaves, a shield that comprises a dielectric material or dielectric material coated metal may be added proximate the coaxial microwave antenna. Furthermore, for high utilization of expensive target materials, a target can rotate to improve the utilization efficiency.

In one set of embodiments of the invention, a coaxial microwave source may be positioned inside a sputtering target that may be rotated for higher material utilization. The sputtering target comprises dielectric materials so that the microwave radiated from the coaxial microwave antenna may leak through the dielectric target. The coaxial microwave source may be linear or planar. A planar source may comprise a group of parallel coaxial microwave line sources.

In another set of embodiments of the invention, a magnetron or a plurality of magnetrons may be placed inside a target that may be rotated for higher material utilization. The magnetrons may help confine the secondary electrons and further enhance ionization. In the case of one magnetron inside the target, the magnetron is preferably in a horizontal position and proximate the bottom of the target to enhance localized ionization above the substrate. Moreover, in the case of a plurality of magnetrons such as two magnetrons inside the target, the magnetrons are preferably positioned at an angle to the horizontal position. The two magnetrons may be located symmetrically to the vertical central axis of the target. Furthermore, magnetrons may be located outside the targets for providing a magnetic field adjacent to the target surface to enhance ionization. An electric potential may be formed between adjacent magnetrons to enhance ionization.

Embodiments of the invention also include a shield for providing directional control of microwave radiation. In the case of one magnetron or two magnetrons inside the target, a shield may be added above the antenna inside the target to help reduce the microwave radiation upward or toward the sides. The shield may help direct the microwave radiation mostly toward the substrate. Furthermore, the shield may comprise dielectric materials or dielectric coated metal materials. An exemplary shape of the shield may be partially circular, or any curved shape. The shield may be positioned in such a way to help provide uniform deposition on a substrate. For example, the center line of the shield may be on a vertical axis or at an angle to the vertical axis.

In different embodiments of the invention, an exemplary twin configuration of the rotatable targets is provided. Inside each target, an antenna is positioned proximate the center of the target. A shield may be added for directional control of microwave radiation. A magnetron or a plurality of magnetrons may be added inside each target for confining electrons and enhancing ionization.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings.

DETAILED DESCRIPTION OF THE INVENTION

1. Overview of Microwave Sputtering Deposition

Figure 1:
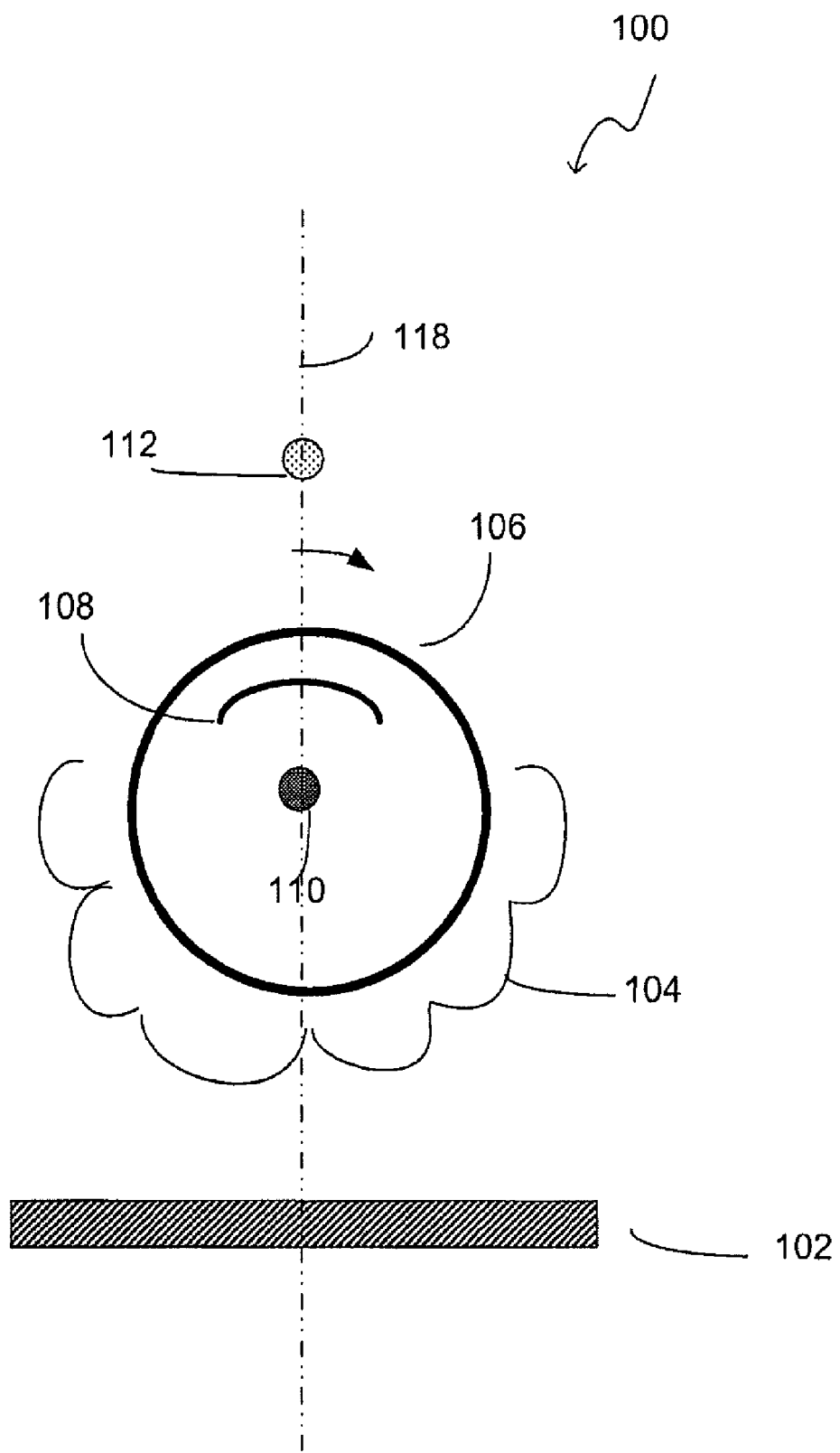
FIG. 1 illustrates a simplified schematic for microwave rotatable sputtering deposition with a microwave source inside a target.

Microwave-assisted PVD has been developed to achieve higher plasma densities (e.g. $\sim 10^{12}$ ions/cm$^3$) and higher deposition rate, as a result of improved power coupling and absorption at 2.45 GHz when compared to a typical radio frequency (RF) coupled plasma sources at 13.56 MHz. One drawback of the RF plasma is that a large portion of the input power is dropped across the plasma sheath (dark space). By using microwave plasma, a narrow plasma sheath is formed and more power can be absorbed by the plasma for creation of radical and ion species, which increases the plasma density and reduces collision broadening of the ion energy distribution to achieve a narrow energy distribution.

Microwave plasma also has other advantages such as lower ion energies with a narrow energy distribution. For instance, microwave plasma may have low ion energy of 0.1-25 eV, which leads to lower damage when compared to RF plasma. In contrast, standard planar discharge would result in high ion energy of 100 eV with a broader distribution in ion energy, which would lead to higher damage, as the ion energy exceeds the binding energy for most materials of interest. This ultimately inhibits the formation of high quality crystalline thin films through introduction of intrinsic defects. With low ion energy and narrow energy distribution, microwave plasma helps in surface modification and improves coating properties.

In addition, lower substrate temperature (e.g. lower than 200° C., for instance at 100° C.) is achieved as a result of using microwave plasma source, as increased plasma density at lower ion energy helps reduce defect density of films. Such a lower temperature allows better microcrystalline growth in kinetically limited conditions. Also, standard planar discharge without magnetrons normally requires pressure greater than about 50 mtorr to maintain self-sustained discharge, as plasma becomes unstable at pressure lower than about 50 mtorr. The microwave plasma technology described herein allows the pressure to range from about $10^{-6}$ torr to 1 atmospheric pressure. Therefore, processing windows (e.g. temperature and pressure) are extended by using a microwave plasma source.

In the past, one drawback associated with microwave source technology in the vacuum coating industry was the difficulty in maintaining homogeneity during the scale up from small wafer processing to very large area processing. Microwave reactor designs in accordance with embodiments of the invention address these problems. Arrays of coaxial plasma line sources have been developed to deposit substantially uniform coatings of ultra large area (greater than 1 m$^2$) at high deposition rate to form dense and thick films (e.g. 5-10 μm thick).

An advanced pulsing technique has been developed to control the microwave power for generating plasma, and thus to control the plasma density and plasma temperature. This advanced pulsing technique may reduce the thermal load disposed over the substrate, as the average power may remain low. This feature is relevant when the substrate has a low melting point or a low glass transition temperature, such as in the case of a polymer substrate. The advanced pulsing technique allows high power pulsing into plasma with off times in between pulses, which reduces the need for continuous heating of the substrate. Another aspect of the pulsing technique is significant improvement in plasma efficiency compared to continuous microwave power.

In embodiments of the present invention, microwaves are used to form plasma without use of any electric power applied to a sputtering target as in traditional PVD. These embodiments use microwave as the primary source to form plasma in PVD, that distinguishes from the microwave-assisted PVD, where a microwave antenna is a secondary source to assist in forming plasma, because an electric voltage is applied to the sputtering target to initiate plasma. Moreover, the microwaves are generated from a coaxial microwave antenna or an array of coaxial microwave antennas. The benefits of such a microwave source are discussed above. To further enhance plasma density, magnetrons are added proximate the sputtering target, either inside or outside. An electric potential between adjacent magnetrons may further enhance ionization.

2. Exemplary Microwave Sputtering Sources

FIG. 1 shows a simplified microwave rotatable sputtering deposition system 100 with a single target. Target 106 in a cylindrical tube form can rotate around the center of the target to provide higher utilization of the target material, which is often very expensive. Antenna 110 is a coaxial microwave plasma line source, and is located inside the target at the center. Shield 108 is positioned inside the target 106 and above the antenna 110. The shield 108 may be in a partial circular shape curved toward the antenna 110. Such a shape and orientation help reduce the microwave radiation propagating upward and result in most microwave radiation propagating downward and through the target 106. Plasma 104 is formed proximate the outer surface of the target 106. A gas supply 112 located on the central axis 118 above the target 106 provides a continuous flow of inert gases, such as argon, helium, xenon, and mixtures thereof, to act as sputtering agents. The gas supply 112 may also be located in between the target 106 and substrate 102 (not shown). A film of the target material is formed on the substrate 102 located below the target 106. The substrate 102 may be biased to attract ions to form a film on the substrate 102.

Figure 2:
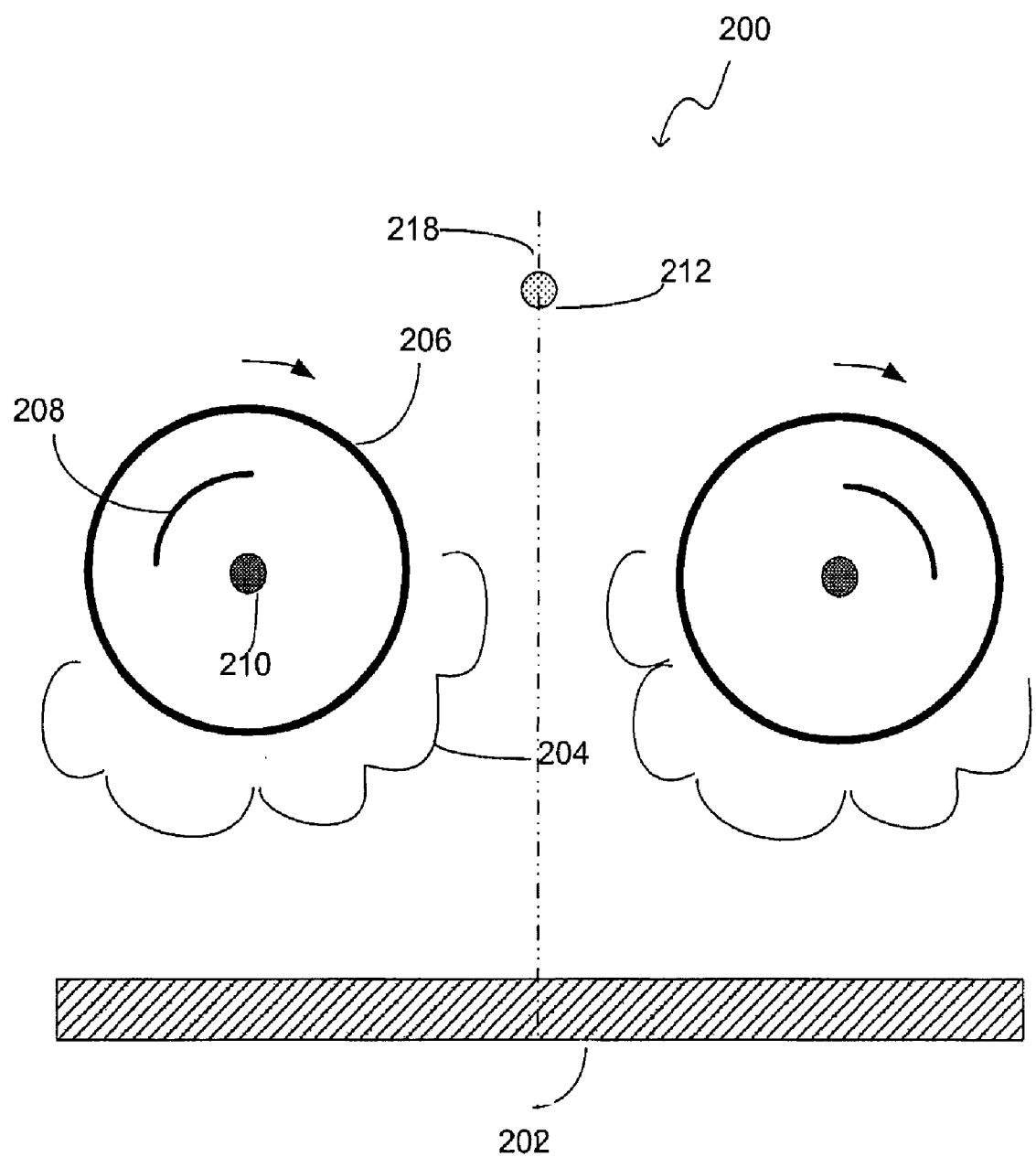
FIG. 2 shows a simplified schematic for a twin configuration of microwave rotatable sputtering deposition with a microwave source inside a target.

In an alternative embodiment illustrated in FIG. 2, a configuration 200 comprises two rotatable targets without any magnetrons. Again, target 206 can rotate to provide higher utilization of the target material. Antenna 210 comprises a coaxial microwave plasma line source and is located inside the target at the center. Shield 208 is positioned inside the target 206, above the antenna 210. The shield 208 may also be in a partial circular shape curved toward the antenna 210. The shield 208 may be tilted from the vertical direction to help direct most microwave radiation downward and through the target 206. Such a shield configuration would help provide uniform deposition on substrate 202. Plasma 204 is formed proximate the outer surface of the target 206. A gas supply 212 located along the central axis 218 above the two targets provides a continuous flow of inert gases such as argon, helium, xenon and mixtures thereof, to act as sputtering agents, although the gas supply 212 may be in any position between the target 206 and substrate 202. A film of the target material is formed on the substrate 202 located below the target 206. The substrate 202 may be biased to attract ions to form a film on the substrate 202.

Figure 3:
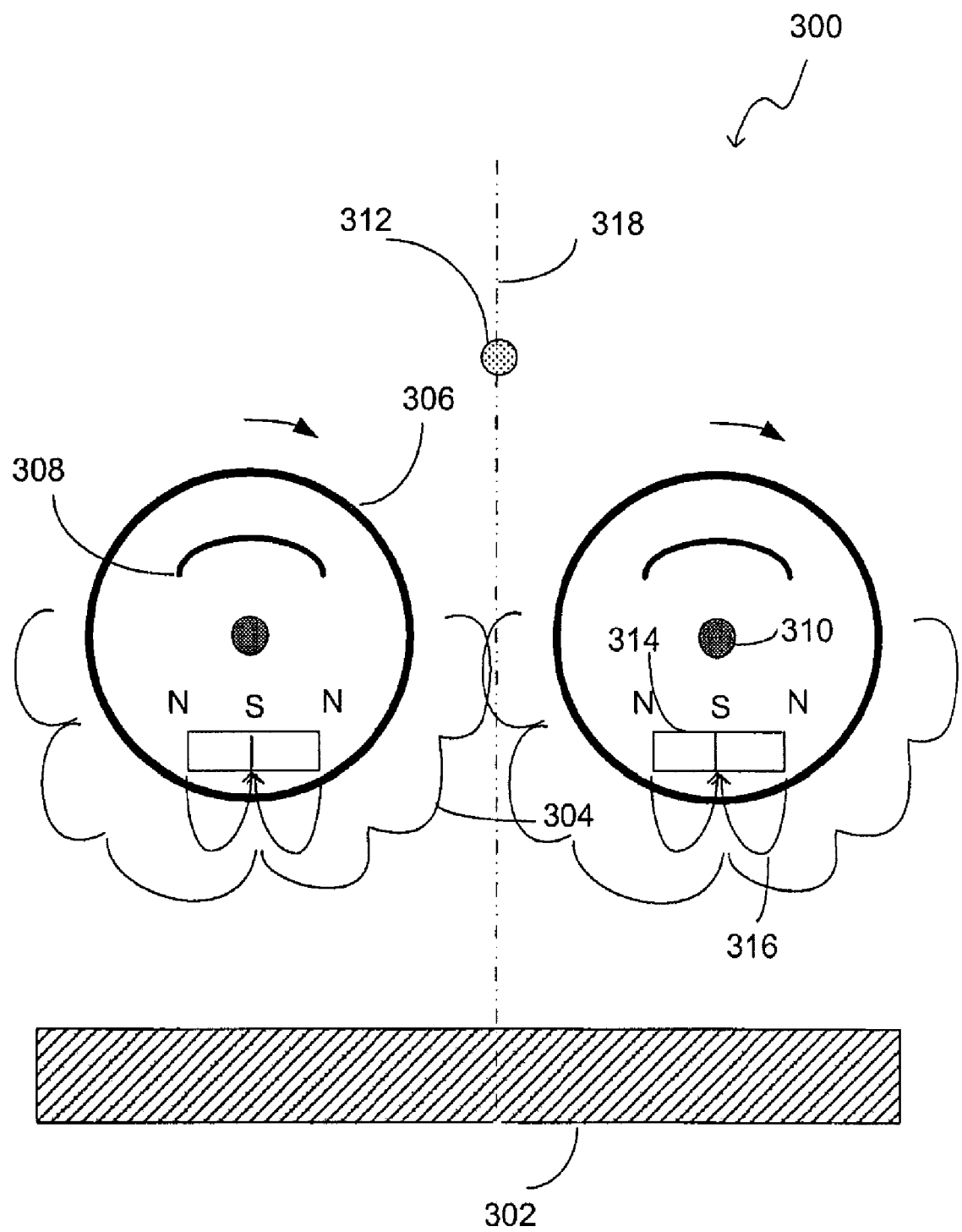
FIG. 3 shows a simplified schematic for a twin configuration of microwave rotatable magnetron sputtering deposition with a single magnetron and a microwave source inside each target.

In another embodiment illustrated in FIG. 3, a configuration 300 comprises two rotatable targets with a single magnetron in each of the targets. Target 306 can rotate to provide higher utilization of the target materials. Antenna 310 comprises a coaxial microwave plasma line source and is located inside the target 306 at the center. Magnetron 314 may be in a horizontal position and proximate the bottom of the target. As illustrated by magnetic field line 316 in FIG. 3, the magnetic field is generated outside the target 306 and localized above substrate 302. This magnetic field helps confine the secondary electrons proximate the target surface and enhance collision and thus ionization. The inventor performed experiments to show that the deposition efficiency may increase about 60 times by using a secondary microwave source to assist in magnetron sputtering. The plasma homogeneity is also significantly improved as a result of microwave injection.

In FIG. 3, shield 308 is also positioned inside the target 306, above the antenna 310. The shield 308 may be in a partial circular shape curved toward the antenna 310 and may in some specific embodiments be in a horizontal position. The shield 308 may help direct most microwave radiation downward and through the target 306. Such a shield configuration helps provide uniform deposition on substrate 302. Plasma 304 is formed proximate the outer surface of the target 306. A gas supply 312 located along the central axis 318 above the two targets 306 provides a continuous flow of inert gases such as argon, to act as sputtering agents. A film of the target material is formed on the substrate 302 located below the target 306. The substrate 302 may be biased to attract ions to form a film on the substrate 302.

Figure 4:
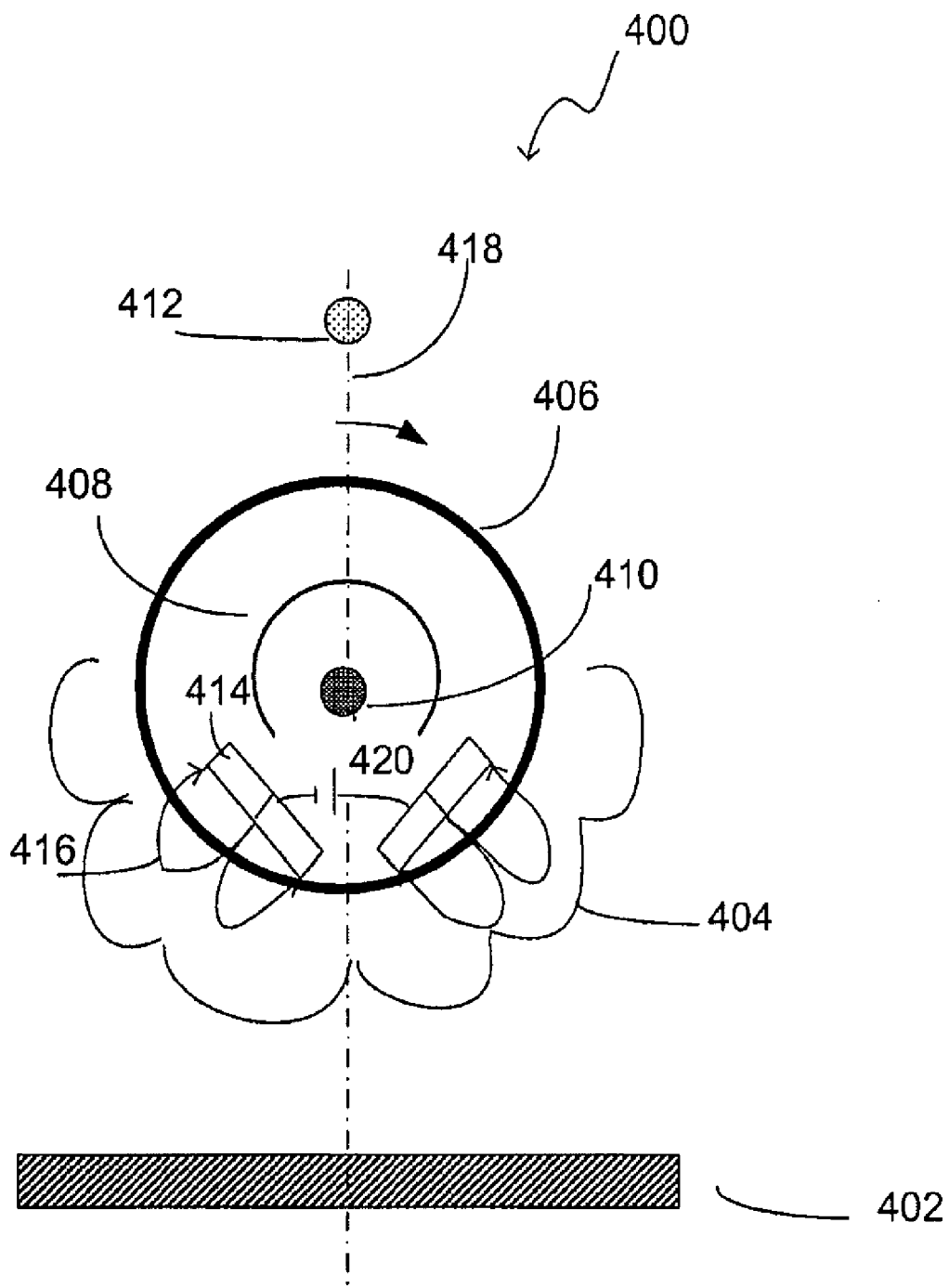
FIG. 4 depicts an alternative schematic for microwave rotatable magnetron sputtering deposition with two magnetrons and a microwave source inside a target.

FIG. 4 provides another configuration 400 with one rotatable target, where two magnetrons 414 are located inside target 406. The two magnetrons 414 are tilted from the vertical central axis 418 at an angle and are in a symmetrical position relative to the central axis 418. Magnetic field line 416 shows that the magnetic field extends downward and outside the target 406. An electric potential 420 may exist between the two magnetrons and would therefore further enhance ionization. Similarly to FIG. 3, an antenna 410 and a shield 408 are positioned inside the target 406. A gas supply line 412 is located on the central axis 418 above the target 406. Plasma 404 is generated outside the target 406 and above substrate 402.

Figure 5:
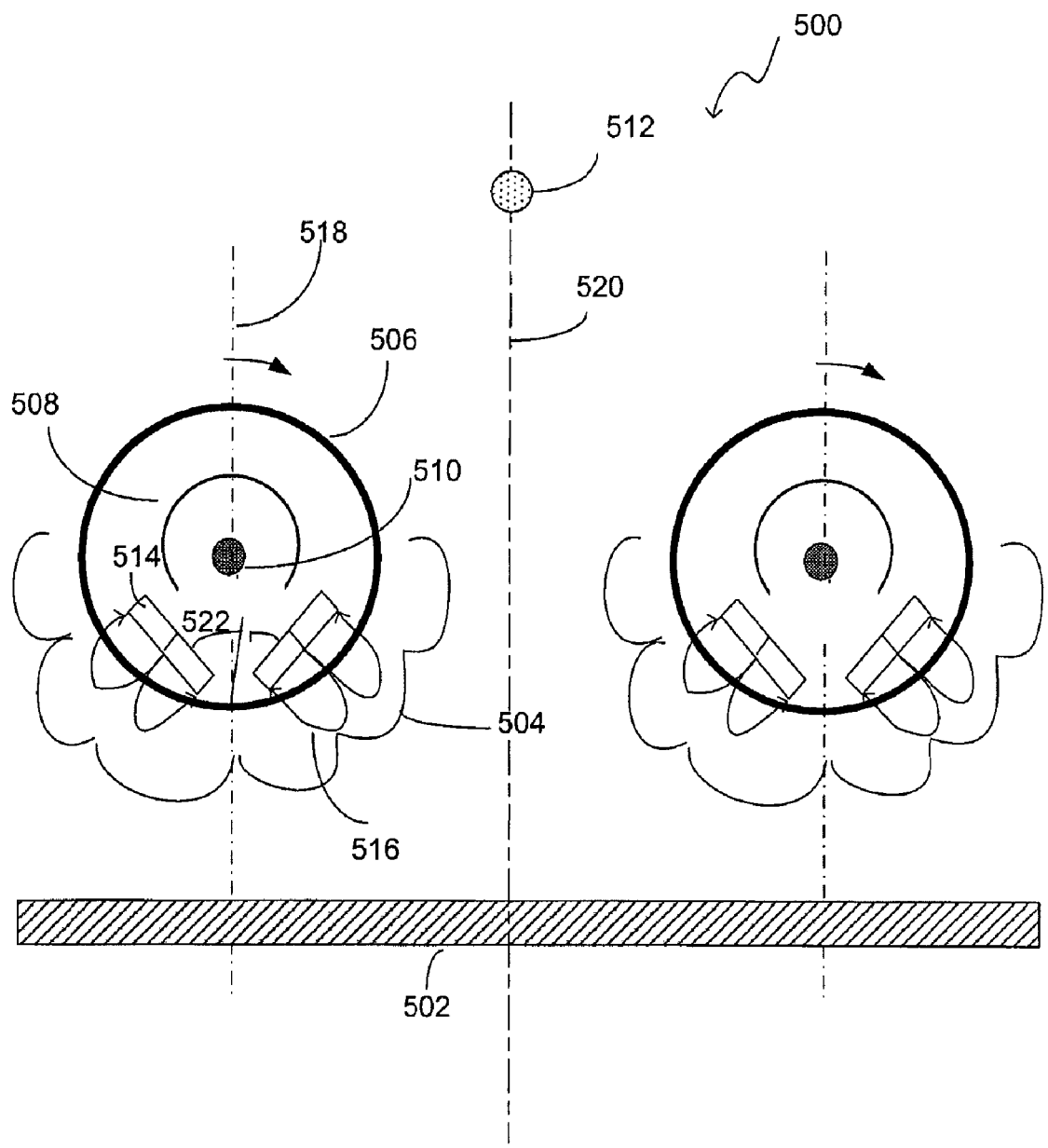
FIG. 5 provides a twin configuration of microwave rotatable magnetron sputtering deposition with two magnetrons and a microwave source inside each target.

FIG. 5 shows a different configuration 500 with two rotatable targets 506. Similar to FIG. 4, two magnetrons 514 are symmetrically positioned inside the target 506 relative to the central axis 518, along with an antenna 510 at the center of the target 506 and a shield 508 above the antenna 510. Magnetic field line 516 shows that the magnetic field extends downward and outside the target 506. An electric potential 522 may exist between the two magnetrons to further increase ionization. A gas supply line 512 is located at the central axis 520 above the two rotatable targets 506. Plasma 504 is formed outside the targets 506. The two targets 506 are symmetrically positioned on the sides of the central axis 520 to provide uniform deposition on substrate 502.

Figure 6:
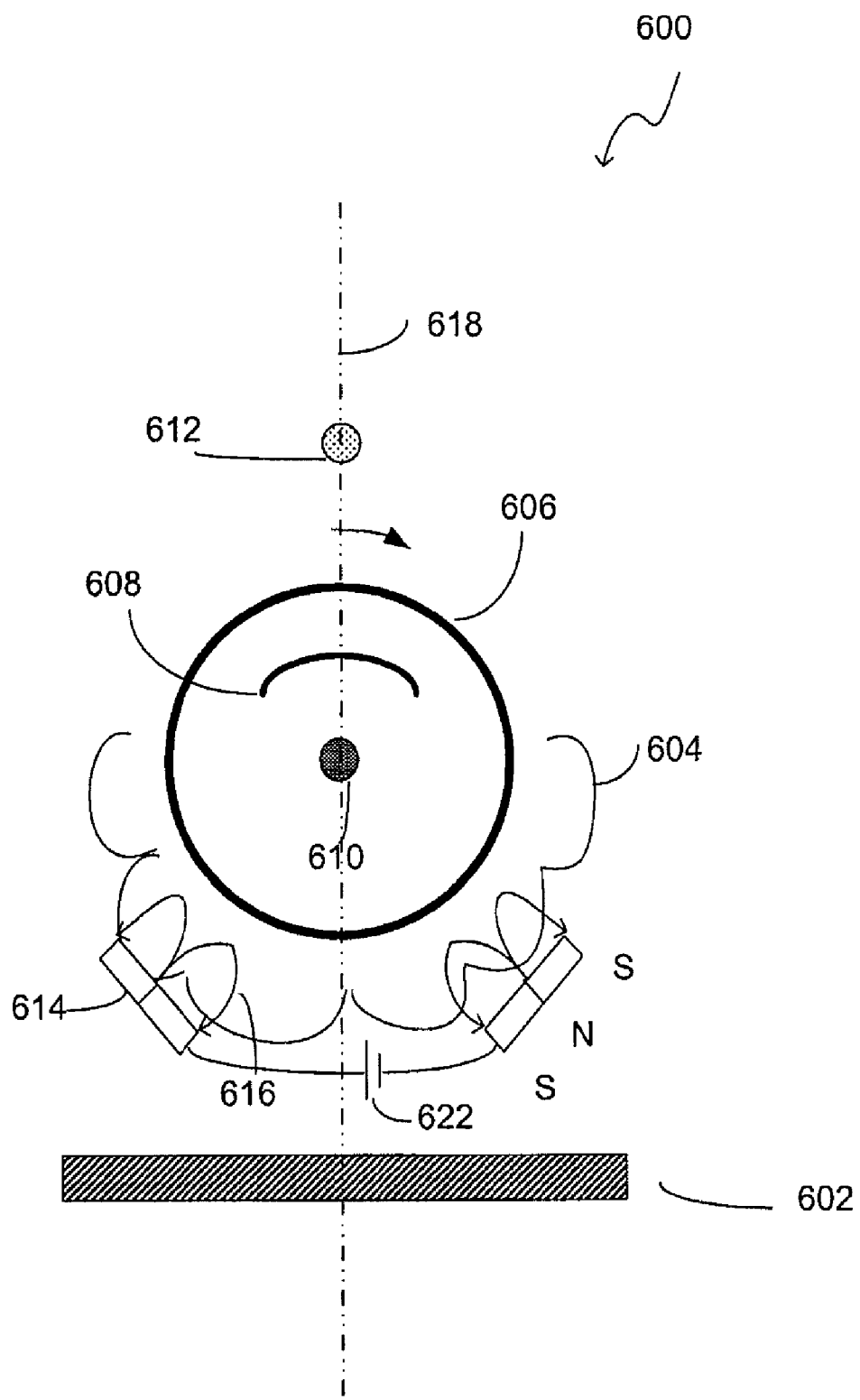
FIG. 6 depicts a different simplified schematic for a coaxial microwave rotatable magnetron sputtering deposition, where magnetrons may locate outside a target.

FIG. 6 illustrates a different configuration 600 for providing magnetic field where two magnetrons 614 are located outside the target for applications such as web coatings. Magnetic field lines 616 extend toward the target surface. Two magnetrons 614 are symmetrically positioned to the central axis 618. An electric potential 622 may be present between the two magnetrons. Again, target 606 can rotate around the center of the target 606. A coaxial microwave antenna 610 is positioned in the center of the target 606. A shield 608, partially circular or curved shape, is above the antenna 610 for reducing the microwave radiation upward. A gas line 612 on the central axis 618 above the target is used for providing sputtering agents. Plasma 604 is formed proximate the surface outside the target 606. Substrate 602 is below the target 606 for film deposition.

Referring to FIGS. 1-5 again, targets 106, 206, 306, 406, and 506 may be made of dielectric material, such as silicon oxide, aluminum oxide, or titanium oxide. The target 106 may be applied by AC, RF, or pulsed power to accelerate free electrons.

3. Exemplary Microwave Sputtering Deposition System

Figure 7:
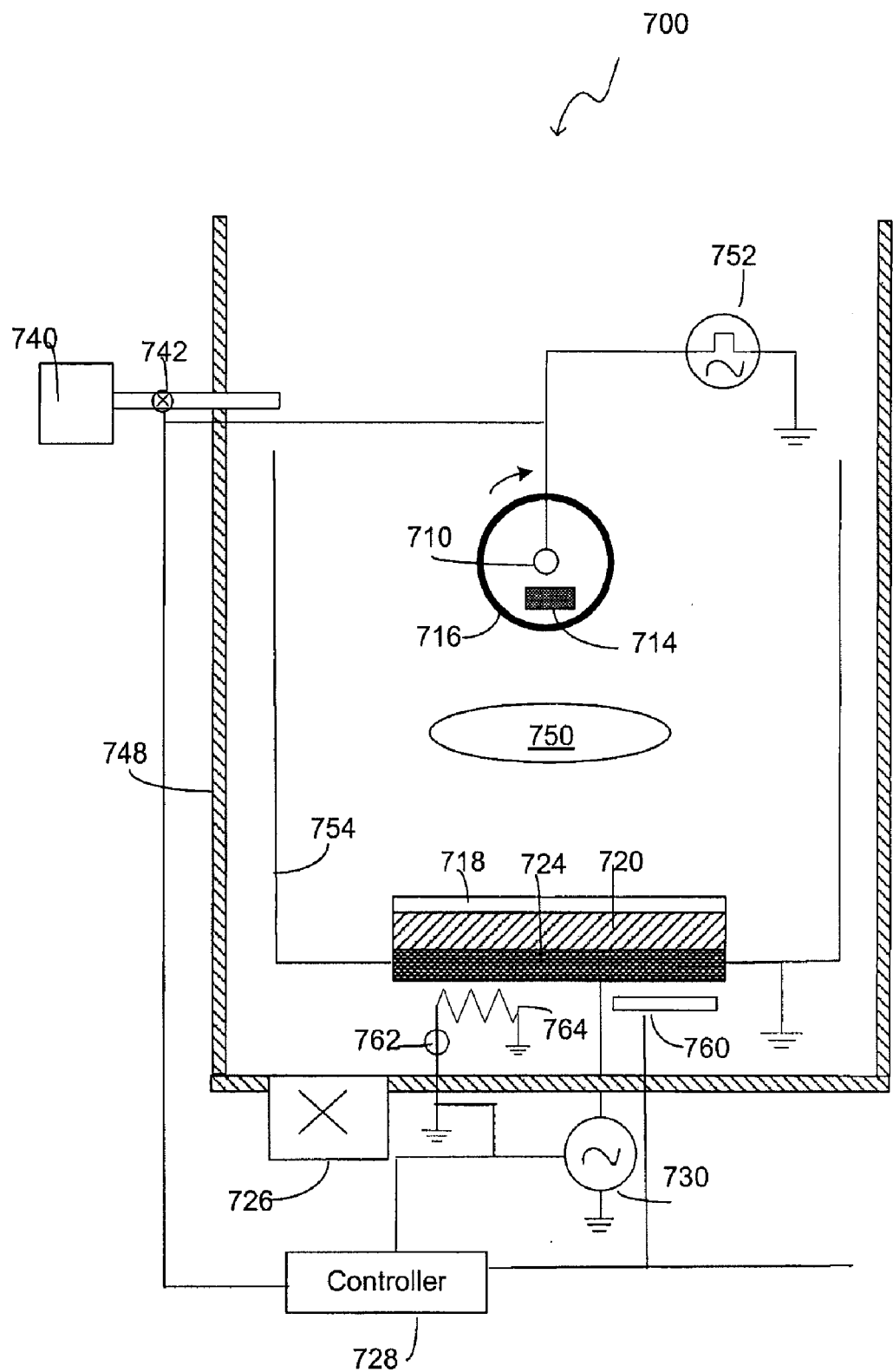
FIG. 7 is an exemplary simplified microwave sputtering deposition system.

FIG. 7 depicts a simplified schematic, cross-sectional diagram of a microwave sputtering system 700 assisted with a magnetron. The system 700 may be used to practice embodiments of the invention. The system 700 includes a vacuum chamber 748, a target 716, a coaxial microwave antenna 710 positioned inside the target 716, a magnetron 714 that is also positioned inside the target 716, a substrate supporting member 724, a vacuum pump system 726, a controller 728, gas supply system 740, and a shield 754 for protecting the chamber walls and the sides of the substrate supporting member from sputtering deposition. The following references, i.e. U.S. Pat. No. 6,620,296 B2, U.S. Patent Application Pub. No. US 2007/0045103 A1, and U.S. Patent Application Pub. No. US2003/0209422 A1, are cited here for exemplary PVD magnetron sputtering systems used by Applied Materials and others. Each of the foregoing patents is incorporated herein by reference for all purposes.

Target 716 is a material to be deposited on a substrate 720 to form a film 718. The target 716 can be rotated for maximizing the utilization of the target material. The target 716 may comprise dielectric materials. The target is typically structured for removable insertion into the corresponding PVD magnetron sputtering system 700. The target 716 is periodically replaced with new targets given that the PVD process erodes away the to-be-deposited material of each target.

The sputtering rate can be significantly increased by using a magnetron as illustrated in FIG. 7. A magnetron 714 is generally positioned near target 716, for example inside the target as shown in FIG. 7. The magnetron 714 has opposed magnets for creating magnetic field within the chamber near by the magnetron 714. The magnetic field confines secondary electrons, for charge neutrality, so that the ion density would increase to form a high density plasma 750 within the chamber adjacent to the magnetron 714. The magnetron 714 is stationery. The magnetron 714 may have variable sizes, positions, and a number of shapes for controlling the degree of plasma ionization. The magnetron 714 may have any shapes, among others, an oval, a triangle, a circle, and a flattened kidney shape. The magnetron 714 may also have an unbalanced design, i.e. the magnetic flux of the outer pole may be greater than the magnetic flux produced by the inner pole. A few references are provided here, e.g. U.S. Pat. No. 5,242,566 for a flattened kidney shape magnetron, U.S. Pat. No. 6,306,265 for a triangularly shaped outer pole, U.S. Pat. No. 6,290,825 for different shapes of magnetron. Each of the foregoing patents is incorporated herein by reference for all purposes.

The coaxial microwave antenna 710 subjected to a pulsed or continuous power 752 radiates microwave, for example, through the target 716 as shown in FIG. 7 when the target 716 comprises dielectric materials. The microwave inputs energy into the plasma and the plasma is heated to enhance ionization and thus increase plasma density. The coaxial microwave antenna 710 may be linear or planar. The planar microwave antenna comprises a plurality of parallel coaxial microwave antennas. The length of antenna 710 may be up to 3 m in some embodiments. One aspect of the coaxial microwave antenna 710 is to provide homogeneous discharge adjacent to the sputtering target 716. This would allow uniform deposition of a large area over substrate 720.

Unlike the traditional microwave-assisted sputtering deposition, no electric power is applied to the sputtering target 716 as shown in FIG. 7. The plasma is formed by microwaves and may be further enhanced by a magnetic field generated from magnetrons and a possible electric potential formed between the magnetrons.

For the purpose of controlling the deposition of sputtered layer 718 on substrate 720, the substrate 720 may be biased by a RF power 730 coupled to the substrate supporting member 724 which is provided centrally below and spaced apart from the target 716, usually within the interior of the shield 754. The bias power may have a typical frequency of 13.56 MHz, or more generally between 400 kHz to about 500 MHz. The supporting member is electrically conductive and is generally coupled to ground or to another relatively positive reference voltage so as to define a further electrical field between the target 716 and the supporting member 724. The substrate 720 may be a wafer, such as a silicon wafer, or a polymer substrate. The substrate 720 may be heated or cooled during sputtering, as a particular application requires. A power supply 762 may provide current to a resistive heater 764 embedded in the substrate supporting member 724, commonly referred to as a pedestal, to thereby heat the substrate 720. A controllable chiller 760 may circulate chilled water or other coolants to a cooling channel formed in the pedestal. It is desirable that the deposition of film 718 be uniform across the entire top surface of the substrate 720.

Vacuum pump 726 can pump the chamber 748 to a very low base pressure in the range of $10^{-8}$ torr. A gas source 740 connected to the chamber 748 through a mass flow controller 742 supplies inert gases such as argon (Ar), helium (He), xenon (Xe), and/or combinations thereof. The gases may be flowed into the chamber near the top of the chamber as illustrated in FIG. 7 above the antenna 710, magnetron 714, and target 716, or in the middle of the chamber (not shown) between the substrate 720 and target 716. The pressure of the sputtering gases inside the chamber is typically maintained between 0.2 mtorr and 100 mtorr.

A microprocessor controller 728 controls the mass flow controller 742, a bias power supply 730, a pulsed or continuous power supply to the microwave source 752, a resistive heater 764 and a chiller 760. The controller 728 may include, for example, a memory such as random access memory, read only memory, a hard disk drive, a floppy disk drive, or any other form of digital storage, local or remote, and a card rack coupled to a general purpose computer processor (CPU). The controller operates under the control of a computer program stored on the hard disk or through other computer programs, such as stored on a removable disk. The computer program dictates, for example, the timing, mixture of gases, biased RF power for substrate, pulsed power or continuous power to the microwave source, substrate temperature, and other parameters of a particular process.

4. Exemplary Deposition Process

Figure 8:
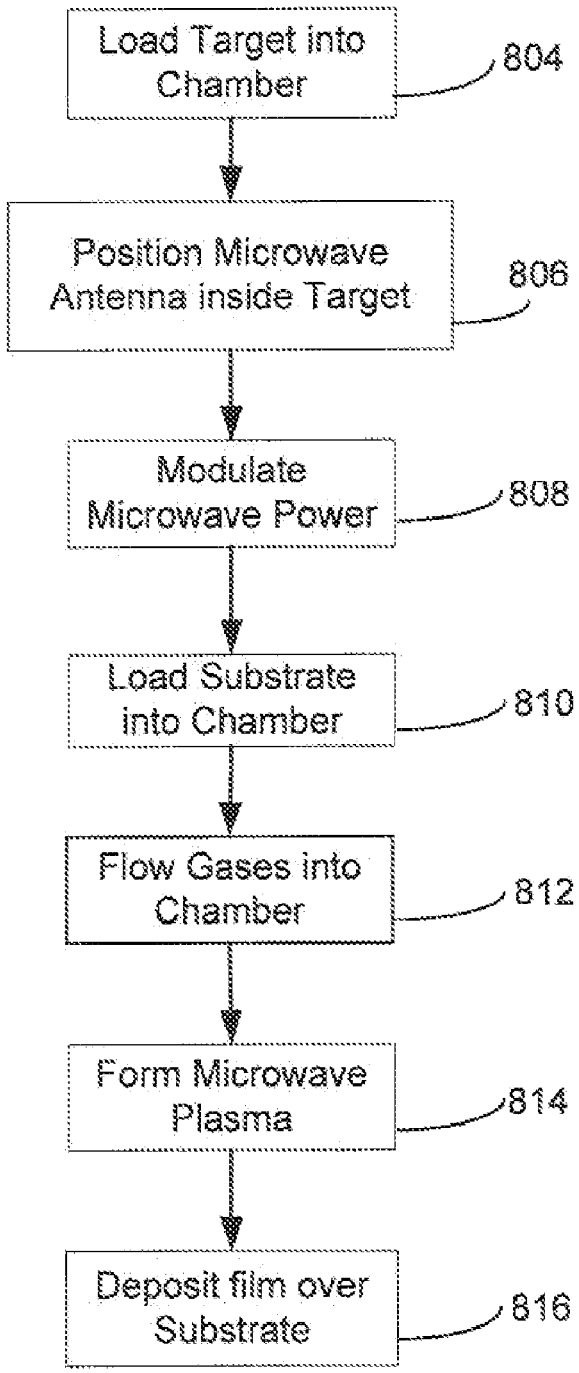
FIG. 8 is a flow chart for illustrating simplified deposition steps for forming a film on a substrate.

For purposes of illustration, FIG. 8 provides a flow diagram of a process that may be used to form a film on a substrate. First, a sputtering target is loaded into a processing chamber at block 804. A coaxial microwave antenna is positioned inside the sputtering target at block 806. The microwave power may be modulated at block 808, for instance, by a power supply using a pulsing power or a continuous power. A substrate is loaded into the processing chamber at block 810. Then, gases such as sputtering agents are flowed into the processing chamber at block 812.

The carrier gases may act as a sputtering agent. For example, the carrier gas may be provided with a flow of $H_2$ or with a flow of inert gas, including a flow of He or even a flow of a heavier inert gas such as Ar. The level of sputtering provided by the different carrier gases is inversely related to their atomic mass. Flow may sometimes be provided of multiple gases, such as by providing both a flow of $H_2$ and a flow of He, which mix in the processing chamber. Alternatively, multiple gases may sometimes be used to provide the carrier gases, such as when a flow of $H_2$/He is provided into the processing chamber.

As indicated at block 814, a plasma is formed from the gases by microwave at a frequency ranging from 1 GHz to 10 GHz, for example, commonly at 2.45 GHz (a wavelength of 12.24 cm). In addition, a higher frequency of 5.8 GHz is often used when power requirement is not as critical. The benefit of using a higher frequency source is that it has smaller size (about half size) of the lower frequency source of 2.45 GHz.

In some embodiments, the plasma may be a high-density plasma having an ion density that exceeds $10^{12}$ ions/cm$^3$. Also, in some instances the deposition characteristics may be affected by applying an electrical bias to the substrate. Application of such a bias causes the ionic species of the plasma to be attracted to the substrate, sometimes resulting in increased sputtering. The environment within the processing chamber may also be regulated in other ways in some embodiments, such as controlling the pressure within the processing chamber, controlling the flow rates of the gases and where they enter the processing chamber, controlling the power used in generating the plasma, controlling the power used in biasing the substrate and the like. Under the conditions defined for processing a particular substrate, material is thus deposited over the substrate as indicated at block 816.

5. Exemplary Coaxial Microwave Source and Features

Figure 9A:
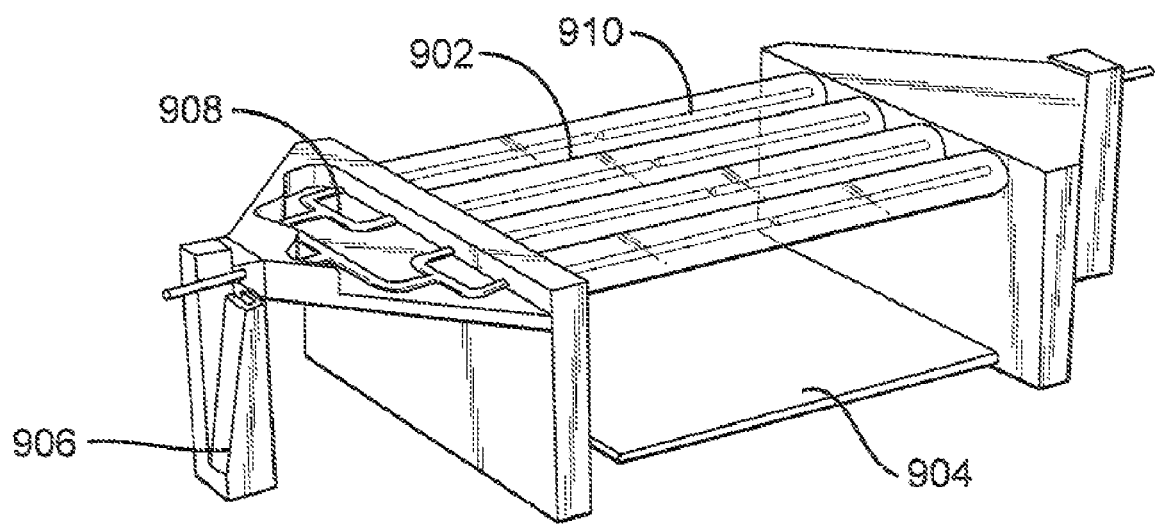
FIG. 9A provides a simplified schematic of a planar plasma source consisting of 4 coaxial microwave line sources.

FIG. 9A shows a schematic of a simplified system including a planar coaxial microwave source 902 consisting of 4 coaxial microwave line sources 910, a substrate 904, a coaxial power provider 908 and an impedance matched rectangular waveguide 906. The coaxial microwave line source may be formed from a coaxial cable by replacing an outer conductive layer by an electrically conductive plasma. The microwave propagation along the coaxial microwave line source experiences a high attenuation by converting electromagnetic wave energy into heating plasma.

The coaxial cable is an electrically conducting cable comprising a substantially round inner conducting center wire being surrounded by a dielectric spacer and then an outer cylindrical conducting layer. Electromagnetic field may be present substantially in the space between the inner conducting center wire and outer cylindrical conducting layer.

In the coaxial microwave line source 910, microwaves are radiated into the chamber in a transversal electromagnetic (TEM) mode where no electric or magnetic field is along the axial or longitudinal direction. This is different from waveguide where electromagnetic waves propagate in a transverse electric (TE) or transverse magnetic (TM) mode. In the TE mode, the electric field is entirely transverse, but the magnetic field has longitudinal components. On the other hand, in the TM mode, the magnetic field is entirely transverse, but the electric field has longitudinal components.

A tube that comprises a dielectric material of a high heat resistance and a low dielectric loss, such as quartz or alumina, acts as the interface between the waveguide and the vacuum chamber. Between the dielectric layer and the waveguide, an atmospheric pressure is maintained by using gases such as air or nitrogen to help cool the waveguide. Microwaves can leak through the dielectric material and ignite a plasma discharge in the processing chamber. Another configuration is without quartz or alumina outside the microwave source. This configuration is used in embodiments of this invention for microwave sputtering, where the target replaces the dielectric material such as quartz or alumina.

Figure 9B:
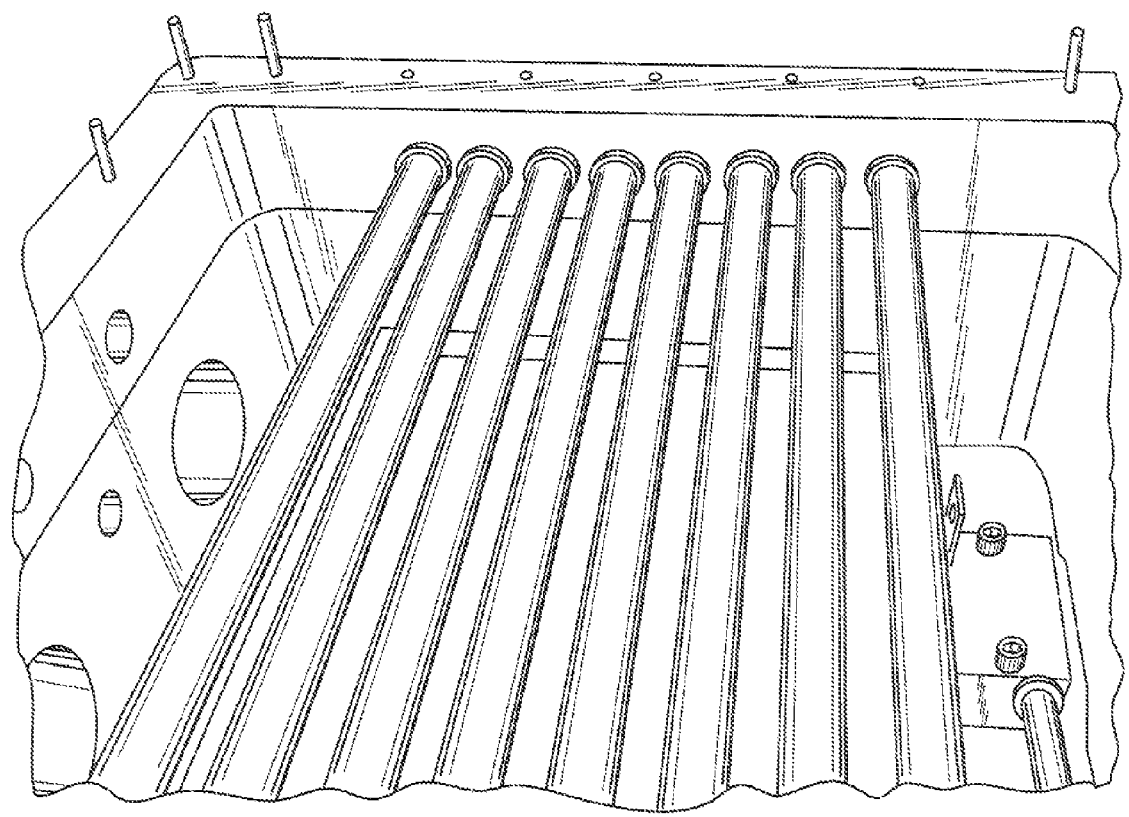
FIG. 9B provides an optical image of a planar microwave source consisting of 8 parallel coaxial microwave plasma sources.

FIG. 9B shows an optical image of a planar coaxial microwave source consisting of 8 parallel coaxial microwave line sources. The length of each coaxial microwave line may be up to 3 m in some embodiments.

Typically, the microwave plasma line uniformity is about ±15%. The inventors have performed experiments to demonstrate that approximately ±1.5% of homogeneity over 1 m$^2$ can be achieved in dynamic array configuration and 2% over 1 m$^2$ in static array configurations. This homogeneity may be further improved to be below ±1% over large areas.

Furthermore, when plasma density increases to above 2.2× $10^{11}$/cm$^3$, the plasma density starts to saturate with increasing microwave power. The reason for this saturation is that the microwave radiation is reflected more once the plasma density becomes dense. Due to the limited power in available microwave sources, microwave plasma line sources of any substantial length may not achieve optimal plasma conditions i.e. very dense plasma. Pulsing microwave power into magnetron allows for much higher peak energy into the antenna than continuous microwave, such that the optimal plasma condition can be approached.

Figure 10:
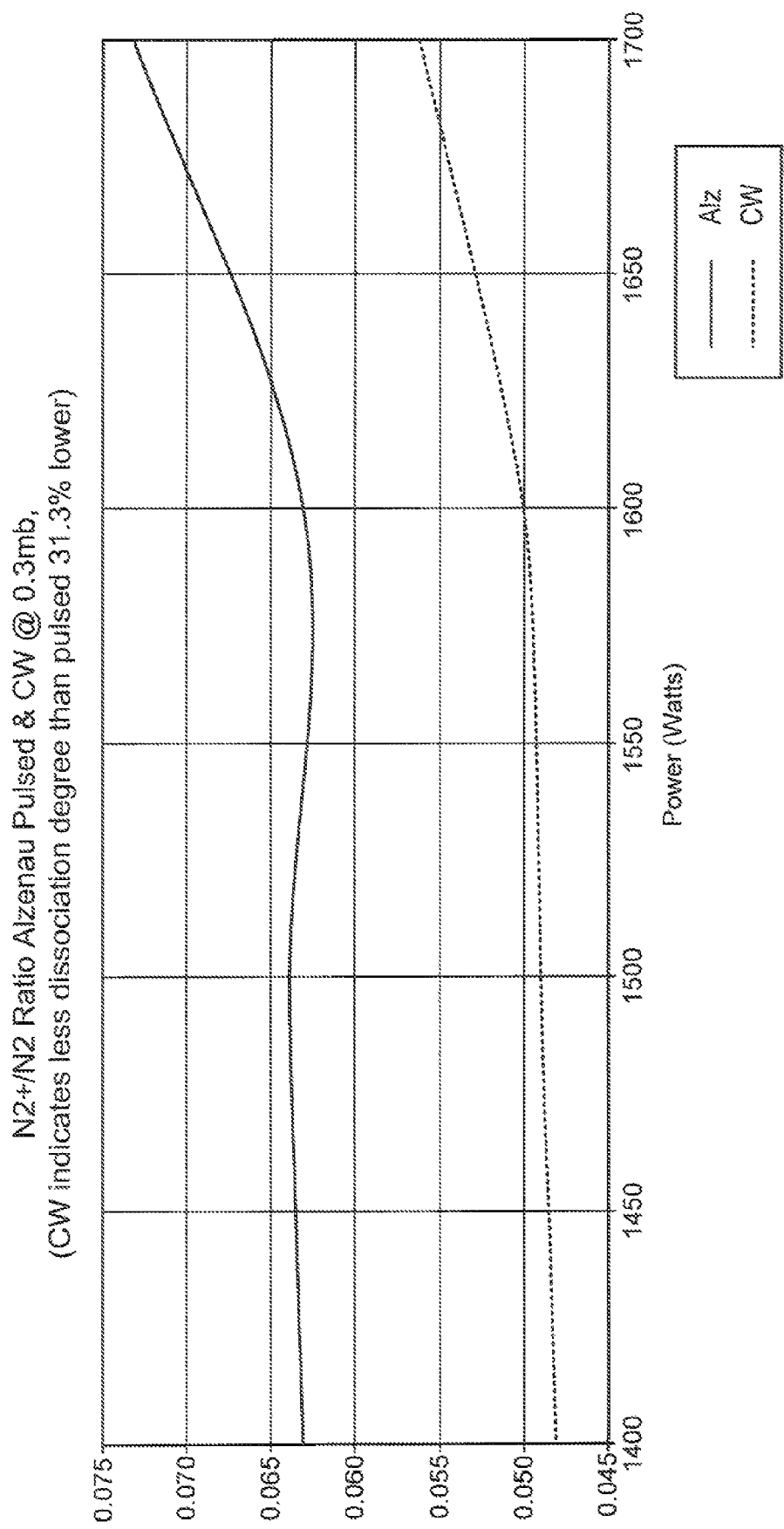
FIG. 10 is showing the improved plasma efficiency in using pulsed microwave power when compared to continuous microwave power.

FIG. 10 shows a graph which illustrates an improved plasma efficiency of a pulsing microwave over a continuous microwave, assuming that the pulsing microwave has the same average power as the continuous microwave. Note that the continuous microwave results in less disassociation as measured by the ratio of nitrogen radical $N_2+$ over neutral $N_2$. A 31% increase in plasma efficiency can be achieved by using pulsed microwave power.

While the above is a complete description of specific embodiments of the present invention, various modifications, variations and alternatives may be employed. Moreover, other techniques for varying the parameters of deposition could be employed in conjunction with the coaxial microwave plasma source. Examples of the possible variations include but are not limited to the different shapes of magnetron, the shield shape and position, the magnetic field applied outside the target instead of inside the target, the microwave source, linear or planar, pulsed or continuous power to the microwave source, the RE bias condition for the substrate, the temperature of the substrate, the pressure of deposition, and the flow rate of inert gases and the like.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

What is claimed is:

1. A system for microwave rotatable sputtering deposition, the system comprising:
   a processing chamber;
   a target comprising a dielectric material in substantially a tube configuration, wherein the target includes a sputtering surface on an outside of the target;
   a coaxial microwave antenna disposed inside the target for generating microwaves;
   a shield positioned around the coaxial microwave antenna inside the target for directional control of the generated microwaves;
   a gas system configured for supplying gases into the processing chamber; and a substrate support member configured in the processing chamber for holding the substrate.

2. The system for microwave rotatable sputtering deposition of claim 1, wherein the target is configured to rotate around a central axis of the target.

3. The system for microwave rotatable sputtering deposition of claim 1, wherein the target comprises a plurality of targets, each such target comprising a respective coaxial microwave antenna and shield.

4. The system for microwave rotatable sputtering deposition of claim 3, wherein the plurality of targets are positioned above the substrate for providing substantially uniform deposition.

5. The system for microwave rotatable sputtering deposition of claim 1, wherein the coaxial microwave antenna comprises a plurality of parallel coaxial microwave antennas.

6. The system for microwave rotatable sputtering deposition of claim 1, wherein the microwaves are in a transversal electromagnetic wave (TEM) mode.

7. The system for microwave rotatable sputtering deposition of claim 1, wherein the shield comprises a partially circular shape or curved shape.

8. The system for microwave rotatable sputtering deposition of claim 1, wherein the shield comprises at least one of dielectric material or dielectric coated metal base material.

9. The system for microwave rotatable sputtering deposition of claim 1, wherein a magnetron is positioned proximate the target.

10. The system for microwave rotatable magnetron sputtering deposition of claim 9, wherein the target is configured to rotate around a central axis of the target.

11. The system for microwave rotatable magnetron sputtering deposition of claim 9, wherein the target comprises a plurality of targets, each such target comprising a respective magnetron, coaxial microwave antenna, and shield.

12. The system for microwave rotatable magnetron sputtering deposition of claim 11, wherein the plurality of targets are positioned above the substrate for providing substantially uniform deposition.

13. The system for microwave rotatable magnetron sputtering deposition of claim 11, wherein the coaxial microwave antenna comprises a plurality of parallel coaxial microwave antennas.

14. The system for microwave rotatable magnetron sputtering deposition of claim 11, wherein the shield comprises at least one of dielectric material or dielectric coated metal base material.

15. The system for microwave rotatable magnetron sputtering deposition of claim 11, wherein the shield comprises a partially circular shape or curved shape.

16. The system for microwave rotatable magnetron sputtering deposition of claim 9, wherein the magnetron comprises at least two magnetrons, each such magnetron being angled from a horizontal position and being positioned symmetrically about a central axis of the target.

\* \* \* \* \*